US011506765B2

(12) United States Patent
Calder et al.

(10) Patent No.: US 11,506,765 B2
(45) Date of Patent: Nov. 22, 2022

(54) HYBRID CENTER OF MASS METHOD (CMM) PIXEL

(71) Applicant: Sense Photonics, Inc., Durham, NC (US)

(72) Inventors: Neil Calder, Edinburgh (GB); Tarek Al Abbas, Edinburgh (GB); Hod Finkelstein, Berkeley, CA (US)

(*) Notice: Subject to any disclaimer, the term of this patent is extended or adjusted under 35 U.S.C. 154(b) by 367 days.

(21) Appl. No.: 16/704,548

(22) Filed: Dec. 5, 2019

(65) Prior Publication Data

US 2020/0182983 A1 Jun. 11, 2020

Related U.S. Application Data

(60) Provisional application No. 62/775,616, filed on Dec. 5, 2018.

(51) Int. Cl.
*G01S 7/4865* (2020.01)
*G01S 17/89* (2020.01)
(Continued)

(52) U.S. Cl.
CPC ......... *G01S 7/4865* (2013.01); *G01S 7/4861* (2013.01); *G01S 17/89* (2013.01); *H01L 27/14643* (2013.01); *H01L 31/02027* (2013.01)

(58) Field of Classification Search
CPC ...... G01S 7/4865; G01S 7/4861; G01S 17/89; H01I 31/02027
See application file for complete search history.

(56) References Cited

U.S. PATENT DOCUMENTS

2011/0260036 A1 10/2011 Baraniuk et al.
2017/0187939 A1* 6/2017 Kasuga ............... H04N 5/374
(Continued)

FOREIGN PATENT DOCUMENTS

WO 2018/122560 7/2018

OTHER PUBLICATIONS

International Search Report and Written Opinion corresponding to PCT/US2019/064622, dated Mar. 27, 2020 (8 pages).
(Continued)

*Primary Examiner* — Thanh Luu
(74) *Attorney, Agent, or Firm* — Myers Bigel, P.A.

(57) ABSTRACT

A Light Detection And Ranging (LIDAR) measurement circuit includes a control circuit configured to receive respective detection signals output from one or more single-photon detectors in response to a plurality of photons incident thereon. The control circuit includes a photon counter circuit including a digital counter circuit and an analog counter circuit, the digital counter circuit being responsive to an output of the analog counter circuit or the analog counter circuit being responsive to an output of the digital counter circuit to count detection of respective photons of the plurality of photons based on the respective detection signals, and a time integration circuit configured to output a time integration signal representative of respective times of arrival indicated by the respective detection signals. The control circuit is configured to calculate an estimated time of arrival of the plurality of photons based on a ratio of the time integration signal and the count of the detection of the respective photons of the plurality of photons.

20 Claims, 9 Drawing Sheets

(51) Int. Cl.
  *H01L 31/02*  (2006.01)
  *G01S 7/4861* (2020.01)
  *H01L 27/146* (2006.01)

(56) References Cited

U.S. PATENT DOCUMENTS

| | | |
|---|---|---|
| 2018/0088236 A1 | 3/2018 | Eichenholz et al. |
| 2018/0292257 A1 | 10/2018 | Hayman et al. |
| 2018/0301589 A1 | 10/2018 | Burroughs et al. |
| 2018/0301872 A1 | 10/2018 | Burroughs et al. |

OTHER PUBLICATIONS

Raynor et al., "A single-exposure linear HDR 17-bit hybrid 50μm analogue-digital pixel in 90nm BSI", ISW 2015.

Matwyschuk et al., "A Real time 3D video CMOS sensor with time gated photon counting", 15th IEEE International New Circuits and Systems Conference (NEWCAS), Strasbourg, France, Jun. 25-28, 2017.

Nys et al., "On Configurable Oversampled A/D Converters", IEEE Journal of Solid-State Circuits, vol. 28, Issue 7, Jul. 1993, pp. 736-742.

Extended European Search Report corresponding to EP 19892147.0; dated Jun. 20, 2022 (9 pages).

Krstajic, Nikola, et al., "A 256 × 8 SPAD Line Sensor for Time Resolved Fluorescence and Raman Sensing", ESSCIRC 2014— 40th European Solid State Circuits Conference, 2014, 143-146.

Xu, Jiangtao, et al., "A low data-rate fluorescence lifetime imaging system with CMM pre-processed in-pixel", Microelectronics Journal, 69, 2017, 28-34.

\* cited by examiner

HYBRID CENTER OF MASS METHOD (CMM) PIXEL

CROSS-REFERENCE TO RELATED APPLICATION

This application claims the benefit of priority from U.S. Provisional Patent Application No. 62/775,616 entitled "Hybrid CMM Pixel" filed on Dec. 5, 2018, in the United States Patent and Trademark Office, the disclosure of which is incorporated by reference herein.

FIELD

The subject matter herein relates generally to image sensors, and more specifically to image sensors for imaging in LIght Detection And Ranging (LIDAR) systems.

BACKGROUND

Time of flight (ToF) based imaging is used in a number of applications including range finding, depth profiling, and 3D imaging (e.g., LIDAR, also referred to herein as lidar). Direct time of flight measurement includes directly measuring the length of time between emitting radiation and sensing the radiation after reflection from an object or other target. From this, the distance to the target can be determined.

In some applications, the sensing of the reflected radiation may be performed using an array of photodetectors, including single-photon detectors, such as a Single Photon Avalanche Diode (SPAD) array. One or more photodetectors may define a detector pixel of the array. SPAD arrays may be used as solid-state photodetectors in imaging applications that may require high sensitivity and timing resolution. A SPAD is based on a semiconductor junction (e.g., a p-n junction) that may detect incident photons when biased beyond its breakdown region, for example, by or in response to a strobe signal having a desired pulse width. The high reverse bias voltage generates an electric field of sufficient magnitude such that a single charge carrier introduced into the depletion layer of the device can cause a self-sustaining avalanche via impact ionization. The avalanche may be quenched by a quench circuit, either actively (e.g., by reducing the bias voltage) or passively (e.g., by using the voltage drop across a serially connected resistor), to allow the device to be "reset" to detect further photons. The initiating charge carrier can be photo-electrically generated by means of a single incident photon striking the high field region. It is this feature which gives rise to the name "Single Photon Avalanche Diode." This single photon detection mode of operation is often referred to as "Geiger mode."

Center of Mass Method (CMM) Time of Flight pixels may be configured to calculate the center-of-mass of the distribution of the times-of-arrival (TOA) of signal photons over a time window of interest, which can be used to estimate the distance of and time of flight to a target. For example, a CMM SPAD ToF pixel may count and sum photons and their corresponding times of arrival, which has typically been implemented by integrating many timestamps in-pixel, to calculate the center-of-mass of the TOA distribution.

To count photons that are incident on array of SPADs, some ToF pixel approaches may use either a digital counter or an analog counter to indicate the detection and arrival times of photons, also referred to as time-stamping. Digital counters may be easier to implement and scale, but may be more expensive in terms of area (e.g., with respect to the physical size of the array). Analog counters may be more compact, but may suffer from limited photon counting depth (bit depth), noise, and/or uniformity issues.

To time-stamp incident photons, some SPAD array-based ToF pixel approaches have used a Time-to-Digital Converter (TDC), a Time to Amplitude Converter (TAC), or a counter plus an interpolator, e.g., a global time stamp count plus a TAC. TDCs can be used in time of flight imaging applications to increase timing resolution over that of a single clock cycle.

However, TDC circuits may only be able to process one event in a single measurement cycle, such that multiple TDCs may be used for an array of SPADs. TDCs may also be relatively power consuming, making larger arrays more difficult to implement. TACs may be less power consuming, but may have limited dynamic range when implementing many timestamps in-pixel. TDCs may also generate relatively large amounts of data, e.g., one 16-bit timestamp per photon. A single SPAD connected to a TDC may generate millions of such timestamps per second. An imaging array of greater than 100,000 pixels therefore can generate unfeasibly large data rates relative to the available input/output bandwidth or capability.

The fine resolution created by TDCs is reliant on fast moving digital signals, which may have high power consumption, e.g., a ring oscillator operating at a frequency of about 2 GHz and current of about 200 µA. Some advantages of digital approaches include that the size of the TDC tends to scale with technology node and the stored values can be robust to leakage. With respect to analog approaches, summing multiple analog voltages on a capacitor or integrator may have advantages with respect to averaging (e.g., reduction in noise); however, the dynamic range of the system may vary with the number of stored voltages when using an ADC (analog-to-digital converter) with fixed voltage references. Also, leakage of a least significant bit (LSB; or n LSBs) can be difficult to avoid within the frame read out time.

SUMMARY

In some embodiments of the inventive concept, a Light Detection And Ranging (LIDAR) measurement circuit comprises a control circuit configured to receive respective detection signals output from one or more single-photon detectors in response to a plurality of photons incident thereon. The control circuit comprises a photon counter circuit comprising a digital counter circuit and an analog counter circuit, the digital counter circuit being responsive to an output of the analog counter circuit or the analog counter circuit being responsive to an output of the digital counter circuit to count detection of respective photons of the plurality of photons based on the respective detection signals, and a time integration circuit configured to output a time integration signal representative of respective times of arrival indicated by the respective detection signals. The control circuit is configured to calculate an estimated time of arrival of the plurality of photons based on a ratio of the time integration signal and the count of the detection of the respective photons of the plurality of photons.

In other embodiments, the digital counter circuit is configured to generate a digital output that is representative of a first bit portion of the count of the detection of the respective photons of the plurality of photons, and the analog counter circuit is configured to generate an analog output that is representative of a second bit portion of the count of the detection of each of the plurality of photons.

In still other embodiments, the digital counter circuit is responsive to the output of the analog counter circuit. The first bit portion is a most significant bit portion, and the second bit portion is a least significant bit portion.

In still other embodiments, the analog counter circuit is responsive to the output of the digital counter circuit, the first bit portion is a least significant bit portion, and the second bit portion is a most significant bit portion.

In still other embodiments, at least one of the first bit portion and the second bit portion comprises a middle bit portion between a most significant bit portion and a least significant bit portion.

In still other embodiments, the time integration circuit is further configured to integrate the respective times of arrival indicated by the respective detection signals on both a charge transfer amplifier circuit and a time integration counter.

In still other embodiments, the time integration counter is a digital counter.

In still other embodiments, the time integration counter is an analog counter.

In still other embodiments, the time integration circuit comprises a time to amplitude converter that comprises the charge transfer amplifier circuit and is configured to generate an output voltage responsive to the respective detection signals, and a comparator that is configured to generate a output signal responsive to the output voltage of the time to amplitude converter exceeding a reference voltage. The time integration counter is configured to increment an integrated count of the respective times of arrival responsive to the output signal of the comparator.

In still other embodiments, the time integration circuit further comprises: a pulse generator circuit and a current source. The pulse generator circuit is configured to couple the current source to the charge transfer amplifier circuit responsive to the respective detection signals and a control signal.

In still other embodiments, the time to amplitude converter is configured to generate the output voltage responsive to a time that the current source is coupled to the charge transfer amplifier circuit.

In still other embodiments, the time integration circuit further comprises a reset circuit that is configured to reset the time to amplitude converter by subtracting the reference voltage from the output voltage of the time to amplitude converter to generate a reset voltage and applying the reset voltage to an input of the charge transfer amplifier circuit.

In still other embodiments, the reset voltage represents a first bit portion of an integration of the count of the respective times of arrival. An output of the time integration counter represents a second bit portion of the integration of the count of the respective times of arrival.

In still other embodiments, the first bit portion is a least significant bit portion. The second bit portion is a most significant bit portion.

In still other embodiments, the charge transfer amplifier comprises at least one capacitor that is configured to store a voltage that is at least as large as a voltage corresponding to an expected or maximum time of flight for a respective time of arrival.

In still other embodiments, the single-photon detectors are part of a center of mass method (CMM) based pixel.

In some embodiments of the inventive concept, a LIDAR measurement circuit comprises a control circuit configured to receive respective detection signals output from one or more single-photon detectors in response to a plurality of photons incident thereon. The control circuit comprises a photon counter circuit configured to count detection of respective photons of the plurality of photons based on the respective detection signals, and a time integration circuit configured to output a time integration signal representative of respective times of arrival indicated by the respective plurality of detection signals on both a charge transfer amplifier circuit and a time integration counter. The control circuit is configured to calculate an estimated time of arrival of the plurality of photons based on a ratio of the time integration signal and the count of the detection of the respective photons of the plurality of photons.

In further embodiments, the time integration circuit comprises a time to amplitude converter that comprises the charge transfer amplifier circuit and is configured to generate an output voltage responsive to the respective detection signals, and a comparator that is configured to generate an output signal responsive to the output voltage of the time to amplitude converter exceeding a reference voltage. The time integration counter is configured to increment an integrated count of the respective times of arrival responsive to the output signal of the comparator.

In still further embodiments, the time integration circuit further comprises a reset circuit that is configured to reset the time to amplitude converter by subtracting the reference voltage from the output voltage of the time to amplitude converter to generate a reset voltage and applying the reset voltage to an input of the charge transfer amplifier circuit.

In still further embodiments, the time integration counter comprises a digital counter or an analog counter. The digital counter comprises a flip-flop circuit and the analog counter comprises a capacitor.

Other methods, systems or apparatus, according to embodiments of the inventive concept, will be or become apparent to one with skill in the art upon review of the following drawings and detailed description. It is intended that all such additional systems, methods, articles of manufacture, and/or computer program products be included within this description, be within the scope of the present inventive concept, and be protected by the accompanying claims.

BRIEF DESCRIPTION OF THE DRAWINGS

Other features of embodiments will be more readily understood from the following detailed description of specific embodiments thereof when read in conjunction with the accompanying drawings, in which.

DETAILED DESCRIPTION

In the following detailed description, numerous specific details are set forth to provide a thorough understanding of embodiments of the present disclosure. However, it will be understood by those skilled in the art that the present invention may be practiced without these specific details. In some instances, well-known methods, procedures, components and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

Some embodiments of the inventive concept are directed to arrays of single-photon detectors that implement a Time of Flight (ToF) pixel using both digital and analog circuit approaches. This approach (also referred to herein as a "hybrid pixel") may comprise using both digital and analog circuits for counting and/or timestamping, to reduce power consumption, area, leakage, and/or data size. For example, ToF pixels as described herein may be used for CMM-based calculation of ToF, that is, calculation of the center of mass of the times of arrival (ToA) of the emitter signal photons. However, it will be understood that embodiments of the present inventive concept are not limited to CMM-based methods, and may be applied to other ToF methods and/or in other applications for counting/timestamping photon detection events (e.g., purely counting pixels).

Figure 1A:
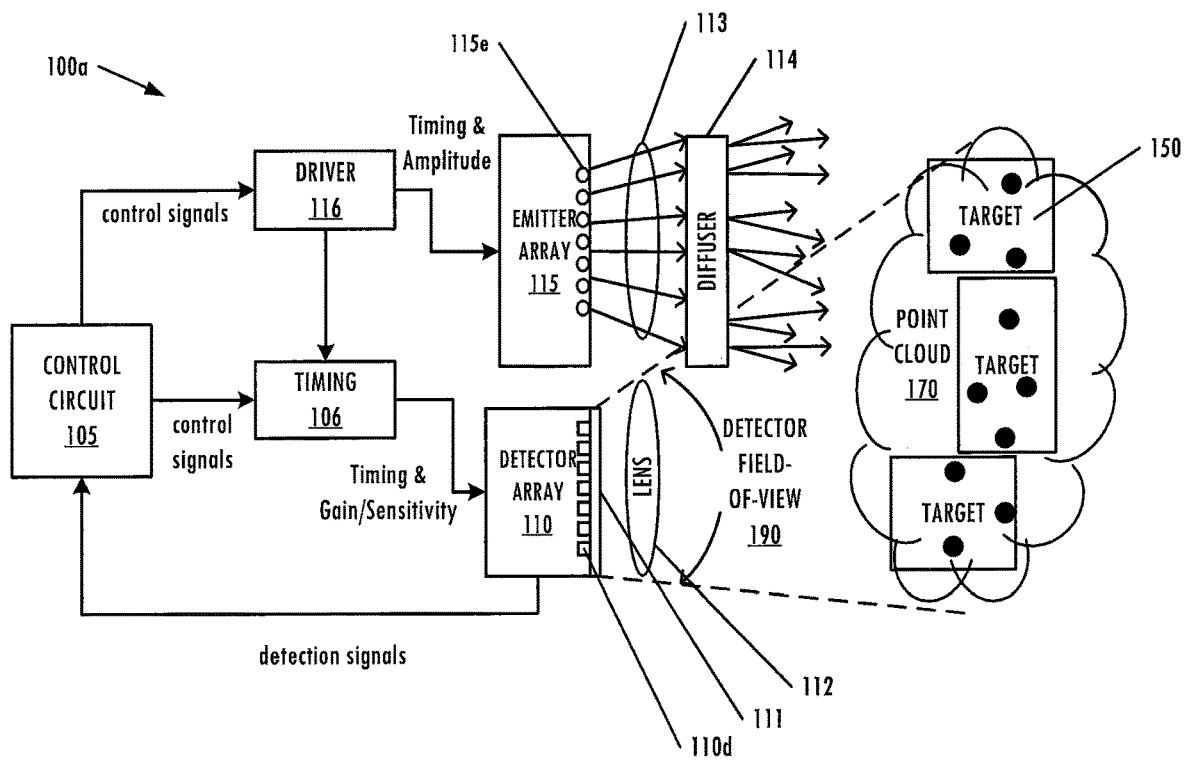
FIGS. 1A and 1B illustrate example ToF measurement systems and related components in LIDAR applications according to some embodiments of the inventive concept.
Figure 1B:
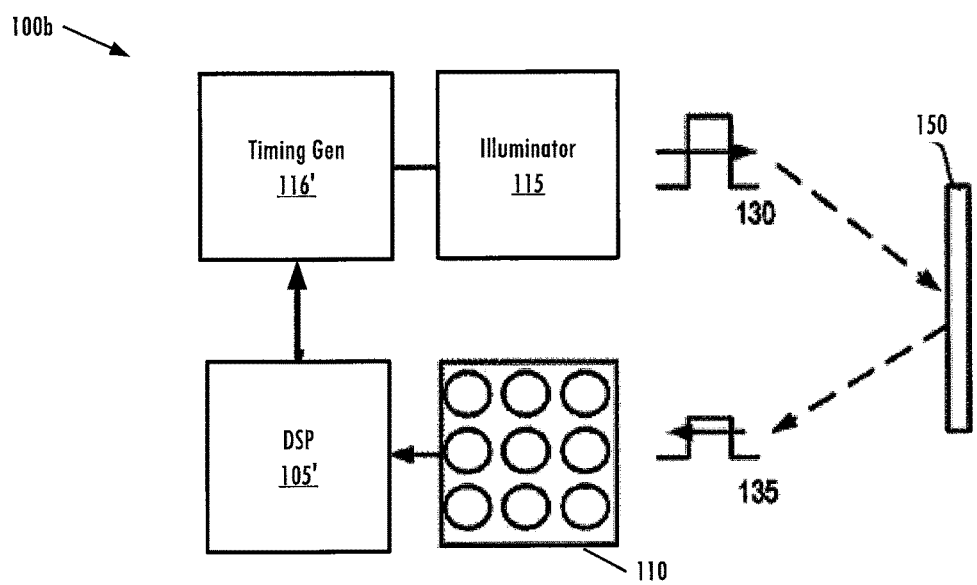

FIGS. 1A and 1B illustrate example ToF measurement systems 100a and 100b and related components in LIDAR applications in accordance with some embodiments of the inventive concept. As shown in FIG. 1A, the system 100a includes a control circuit 105, a timing circuit 106, the illumination source (illustrated as an emitter array 115 including a plurality of emitter elements or emitters 115e), and a detector array 110 including a plurality of detector elements or detectors 110d. Each detector 110d may represent a photodetector (e.g., a photodiode), and one or more detectors 110d may define a respective detector pixel of the detector array 110. One or more emitters 115e of the emitter array 115 may define emitter units that respectively emit a radiation pulse or continuous wave signal (for example, through a diffuser or optical filter 114) at a time and repetition rate controlled by a timing generator or driver circuit 116. In particular embodiments, the emitters 115e may be pulsed light sources, such as LEDs or lasers (such as vertical cavity surface emitting lasers (VCSELs) and/or edge-emitting lasers).

In some embodiments, an emitter module or circuit may include the array 115 of emitter elements 115e, a corresponding array of optical elements 113, 114 coupled to one or more of the emitter elements (e.g., lens(es) 113 (such as microlenses) and/or diffusers 114), and the driver circuit 116. In some embodiments, each of the emitter elements 115e in the emitter array 115 is connected to and controlled by a respective driver circuit 116. In other embodiments, respective groups of emitter elements 115e in the emitter array 115 (e.g., emitter elements 115e in spatial proximity to each other), may be connected to a same driver circuit 116. The driver circuit 116 may include one or more driver transistors configured to control the pulse repetition rate, timing and amplitude of the optical emission signals that are output from the emitters 115e.

In some embodiments, a detector module or circuit includes the array 110 of detectors 110d, receiver optics 112 (e.g., one or more lenses to collect light over the FoV 190 of the array 110), and receiver electronics (including timing circuit 106) that are configured to power, enable, and disable all or parts of the detector array 110 and to provide timing signals thereto. The receiver optics 112 may include a macro lens that is configured to collect light from the largest FoV that can be imaged by the LIDAR system, a spectral filter 111 to pass or allow passage of a sufficiently high portion of the 'signal' light (i.e., light of wavelengths corresponding to those of the optical signals output from the emitters) but substantially reject or prevent passage of non-signal or 'background' light (i.e., light of wavelengths different than the optical signals output from the emitters), microlenses to improve the collection efficiency of the detector pixels, and/or anti-reflective coating to reduce or prevent detection of stray light. The detector array 110 includes time-of-flight sensors (for example, an array of single-photon detectors, such as Geiger-mode avalanche diodes (e.g., SPADs).

The timing circuit 106 may control the timing and gain/sensitivity of the detector array 110. The timing circuit 106 for the detector array 110 may be phase-locked to the driver circuit 116 of the emitter array 115 in some embodiments. The timing circuit 106 may also control the sensitivity of each of the detectors 110d, or of groups of detectors 110d defining a detector pixel. For example, when a detector pixel includes one or more reverse-biased Geiger-mode photodiodes (e.g., SPADs) 110d, the reverse bias applied to each photodiode 110d of the detector pixel may be adjusted (e.g., based on a voltage differential of the electrodes 107 described herein), whereby, the higher the overbias, the higher the sensitivity. The detectors 110d can be activated or deactivated with at least nanosecond precision, and may be individually addressable, addressable by group, and/or globally addressable.

As shown in FIG. 1A, light emission output from one or more of the emitters 115e of the emitter array 115 impinges on and is reflected by one or more targets 150, and the reflected light is detected as an echo signal by one or more of the detectors 110d of the detector array 110, converted into electrical signal representations (referred to herein as detection signals), and processed (e.g., based on time of flight) to define a 3-D point cloud representation 170 of the scene within the field of view 190. Operations of LIDAR systems in accordance with embodiments of the inventive concept as described herein may be performed by one or more processors or controllers, such as the control circuit 105 of FIG. 1A or the digital signal processor (DSP) 105' of FIG. 1B.

FIG. 1B further illustrates components of a ToF measurement system or circuit 100b in a LIDAR application in accordance with some embodiments described herein. The circuit 100b may include a processor circuit (illustrated as DSP 105'), a timing generator 116' which controls timing of the illumination source (illustrated by way of example with reference to a laser emitter array 115), and an array of single-photon detectors (illustrated by way of example with reference to a single-photon detector array 110). The DSP 105' and the timing generator 116' may implement some of the operations of the control circuit 105 and the driver circuit 116 of FIG. 1A. The laser emitter array 115 emits a laser pulse 130 at a time controlled by the timing generator 116'. Light 135 from the laser pulse 130 is reflected back from a target (illustrated by way of example as object 150), and is sensed by single-photon detector array 110. The DSP 105' implements a CMM pixel processor that measures the ToF of the laser pulse 130 and its reflected signal 135 over the journey from emitter array 115 to object 150 and back to the single-photon detector array 110.

The DSP 105' may include logic circuits that provide the necessary timing signals (such as quenching and gating or strobe signals) to control operation of the single-photon detectors of the array 110 and process the detection signals output therefrom. For example, the single-photon detectors of the array 110 may generate detection signals in response to incident photons only during short gating intervals or strobe windows that are defined by the strobe signals. Photons that are incident outside the strobe windows have no effect on the outputs of the single photon detectors.

Thus, in accordance with some embodiments of the inventive concept, the control circuit 105/DSP 105' may be configured to operate responsive to detected photons in the reflected radiation by implementing counter and/or summation/integration circuits in accordance with embodiments described herein. The counter and summation/integration circuits are operable to count and integrate the individual times of arrivals of the detected photons, respectively, in response to the output(s) of one or more detector circuits, e.g., detector array 110, that detect incident photons. The control circuit 105 may include analog and/or digital implementations of counting circuits and/or summing/integration circuits, while the DSP 105' may include digital implementations of the counting circuits and/or summing/integration circuits.

In some embodiments of the inventive concept, the control circuit 105 may include analog and/or digital implementations of counting circuits and/or summing/integration circuits that are operable responsive to inputs received from a SPAD array, e.g., detector array 110, in response to detection of incident photons on the SPAD array.

The DSP 105' may, in accordance with some embodiments of the inventive concept, provide digital implementations of the logic circuits described herein, which may offer advantages over analog implementations. In particular, analog implementations may be limited by characteristics of physical components (e.g., capacitors, resistors) that may impose difficulties with respect to size and/or temperature dependence in semiconductor processes. For example, temperature-dependent components, such as resistors, may impose limitations with respect to calibration and compensation for Process Voltage and Temperature (PVT) dependencies. Analog implementations may also face issues such as leakage of stored charge in capacitors and/or electrical cross-talk. Digital implementations such as the DSP 105' may operate independent of these and/or other limitations that may be faced by analog implementations. The DSP 105' (or other digital implementation of, for example, the control circuit 105) may also be small enough to allow for three-dimensionally stacked implementations, with the array 110 "stacked" on top of the DSP 105' (and other related circuits) that is sized to fit within an area or footprint of the array 110.

The control circuit 105/DSP 105' may also be operable responsive to the output of a correlator that provides output signals in response to incident photons that arrive within a predefined time window of interest. That is, in-pixel correlation, as described herein, may involve calculation of the times-of-arrival (TOAs) of signal photons over the time window of interest defined by the correlator. As such, if a burst of multiple photons arrive substantially concurrently at a SPAD of the array, it has the same effect as a single photon, namely, to discharge that SPAD. Once the SPAD has been discharged by the leading photon, it is blind to all the other photons in the burst, while the remaining SPADs in the array may operate likewise responsive to the multiple photons in the burst. The control circuit 105/DSP 105' may be configured to calculate an estimated time of arrival of the burst of photons based on a ratio of the integrated times of arrival (e.g., as provided by time integration circuits herein) and the count of the detection (e.g., as provided by photon counter circuits herein) of each of the photons by respective SPADs in the array.

The photon counter circuits and/or time integration circuits described hereinafter with respect to FIGS. 2-6 may be implemented in whole or in part in the control circuit 105 and/or the DSP 105' of FIGS. 1A and 1B, in accordance with various embodiments of the inventive concept.

FIGS. 2-5 are block diagrams of LIDAR measurement circuits that may be used in ToF measurement systems according to some embodiments of the inventive concept. For example, the LIDAR measurement circuit embodiments described with respect to FIGS. 2-5 may be used, for example, in the ToF measurement systems 100a and 100b of FIGS. 1A and 1B.

Figure 2:
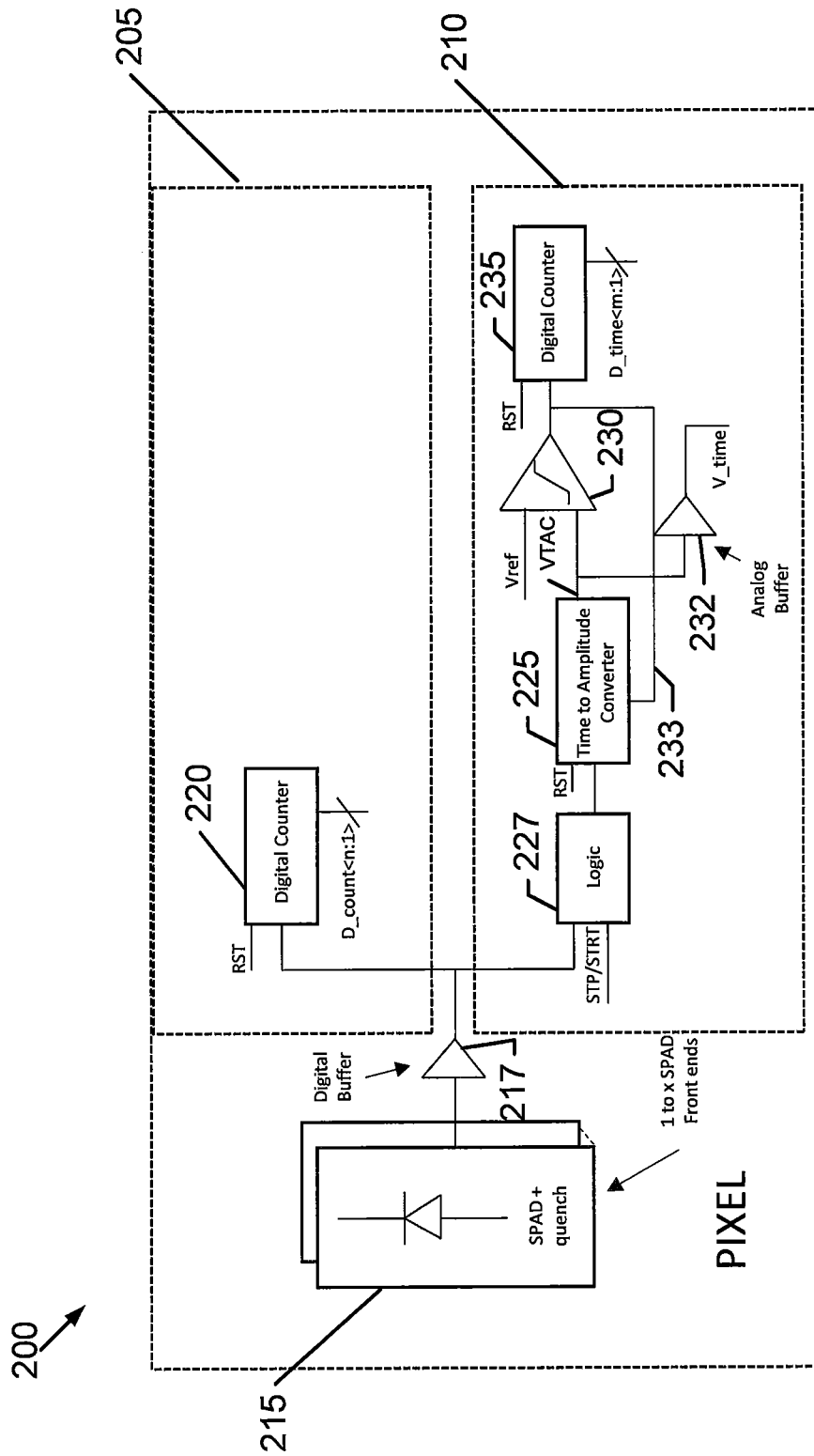
FIGS. 2-5 are block diagrams of LIDAR measurement circuits that may be used in ToF measurement systems according to some embodiments of the inventive concept.

Referring now to FIG. 2, a LIDAR measurement circuit 200 comprises a photon counter circuit 205 and a time integration circuit 210 that are coupled to a pixel 215 in a light detection array that comprises one or more SPADs. Output signals from the pixel 215, e.g., detection signals, may be stored in a digital buffer 217 where they are provided as inputs to the photon counter circuit 205 and the time integration circuit 210. In the example shown in FIG. 2, the photon counter circuit 205 comprises a digital counter 220, which may be implemented, for example, using flip-flops or other suitable logic circuits. The digital counter 220 may be configured to output a photon count signal D_count<n:1> responsive to the photons detected through the SPADs of the pixel 215. The photon count may be reset (e.g., at the end of a detection window or subframe) responsive to the reset signal RST.

The time integration circuit 210 comprises a Time to Amplitude Converter (TAC) circuit 225, which may use an analog technique to convert small time intervals to pulse amplitudes. The TAC circuit 225 may receive SPAD signals at varying time intervals through interface logic 227. The STP/STRT signal may act as a clock for receiving the SPAD pulses from the pixel 215. The output voltage of the TAC circuit 225 (VTAC) may be provided to a comparator 230 and an analog buffer 232. The analog buffer 232 may be implemented as an active circuit used during readout to buffer analog voltages, which may be stored on a capacitor. In some embodiments, the analog buffer 232 may be a source follower circuit. The output voltage VTAC may represent the time integration or time summation of the time stamps associated with the receipt of one or more SPAD pulses, which correspond to received photons. The TAC circuit 225 output voltage VTAC is also provided to a comparator 230, which may increment a digital counter 235 when the output voltage VTAC exceeds a reference voltage Vref. The digital counter 235 may, therefore, output signal D_time<m:1>, which may provide one or more bits of a digital representation of the time integration or time summation of the time stamps associated with the receipt of one or more SPAD pulses. The digital counter 235 may comprise a flip-flop circuit in some embodiments. For example, the digital counter 235 may be used to output one or more most significant bits (MSBs), while one or more least significant bits (LSBs) are represented in analog form via the analog buffer 232. In some embodiments, the analog output signal V_time from the analog buffer 232 may be converted to digital form through an analog to digital converter to be combined with the digital output from the digital counter 235. In other embodiments, an analog counter comprising, for example, one or more capacitors, may be used in place of the digital counter 235 and its output along with the output of the analog buffer 232 may be converted to digital form using analog to digital converters. The TAC circuit 225 may be reset via feedback loop 233 from the output of the comparator 230 and the digital counter 235 may be reset responsive to a reset signal RST. Example embodiments of the time integration circuit 210 are described hereinbelow with respect to FIGS. 6 and 7.

Figure 3:
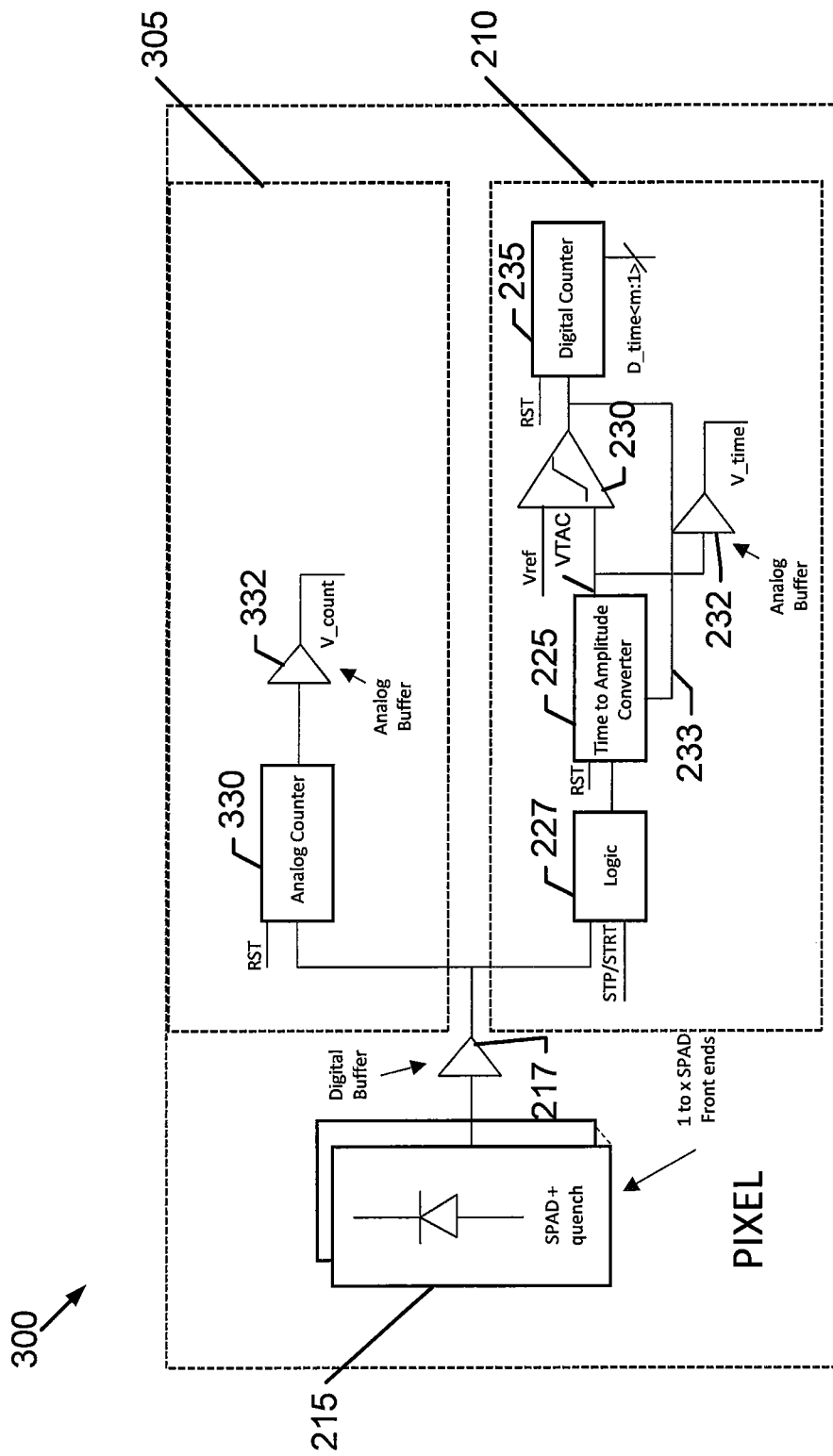

Referring now to FIG. 3, a LIDAR measurement circuit 300 comprises a photon counter circuit 305 and a time integration circuit 210 that are coupled to a pixel 215 in a light detection array that comprises one or more SPADs. The time integration circuit 210 and pixel 215 embodiments are the same as those described above with respect to FIG. 2. In the example shown in FIG. 3, however, the photon counter circuit 305 comprises an analog counter 330, which may be configured to output a voltage signal V_count that is representative of the number of photons detected through the SPADs of the pixel 215. The analog counter 330 may be implemented as a capacitor or other suitable voltage or charge storage device. The voltage V_count may be buffered in an analog buffer 332.

Figure 4:
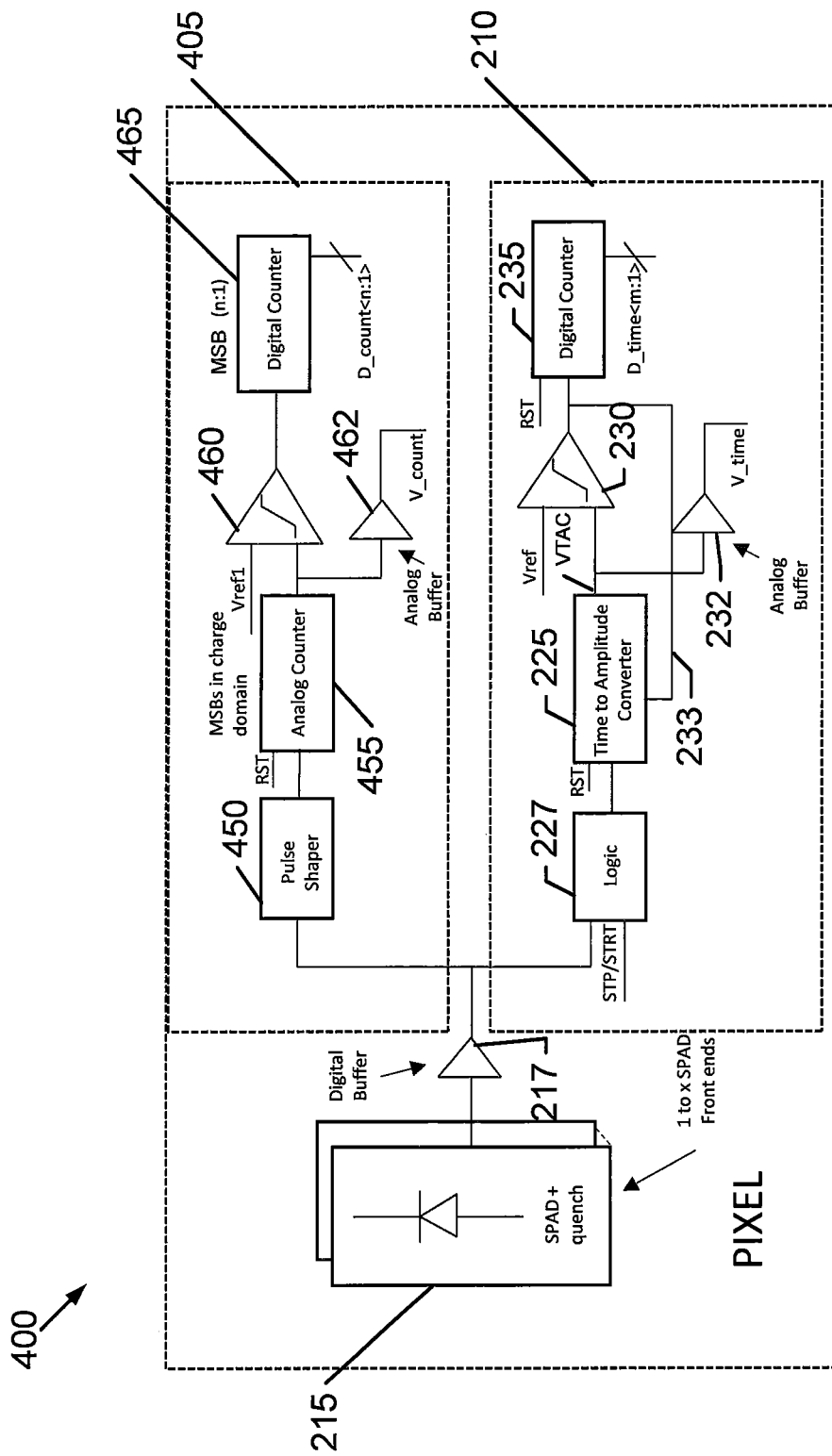

Referring now to FIG. 4, a LIDAR measurement circuit 400 comprises a photon counter circuit 405 and a time integration circuit 210 that are coupled to a pixel 215 in a light detection array that comprises one or more SPADs. The time integration circuit 210 and pixel 215 embodiments are the same as those described above with respect to FIG. 2. In the example shown in FIG. 4, however, the photon counter circuit 405 is a hybrid design that incorporates both analog and digital functionality. The photon counter circuit 405 comprises a pulse shaper 450, which may serve as a filter for the SPAD pulses received from the pixel 215 to ensure that each SPAD pulse results in approximately an equal amount of charge or voltage applied to the analog counter 455. The analog counter 455 may be configured to output a voltage signal that is representative of the number of SPAD pulses (e.g., photons received) from the pixel 215. The analog counter 455 may be implemented as a capacitor or other suitable charge storage or voltage storage device. The output of the analog counter 455 may be provided as an input to a comparator 460, which compares the output of the analog counter 455 with a reference voltage Vref1. The analog counter 455 may be reset in response to a reset signal RST. When the output voltage of the analog counter exceeds the reference voltage Vref1, the comparator 460 may generate a signal to increment the count of a digital counter 465, which provides a photon count signal D_count<n:1>, and the analog counter 455 may be reset responsive to the reset signal RST so it may begin a new count. In some embodiments, an analog buffer 462 may be configured to buffer a voltage corresponding to a difference between the output of the analog counter 455 and the reference voltage Vref1, which may be output as signal V_count. The output voltage signal V_count may represent the LSBs of the photon count while the output of the digital counter 465 D_count<n:1> may represent the MSBs of the photon count. The output voltage signal V_count may be converted to digital form using an analog to digital converter and combined with the output D_count<n:1> of the digital counter 465 in some embodiments of the inventive concept.

Figure 5:
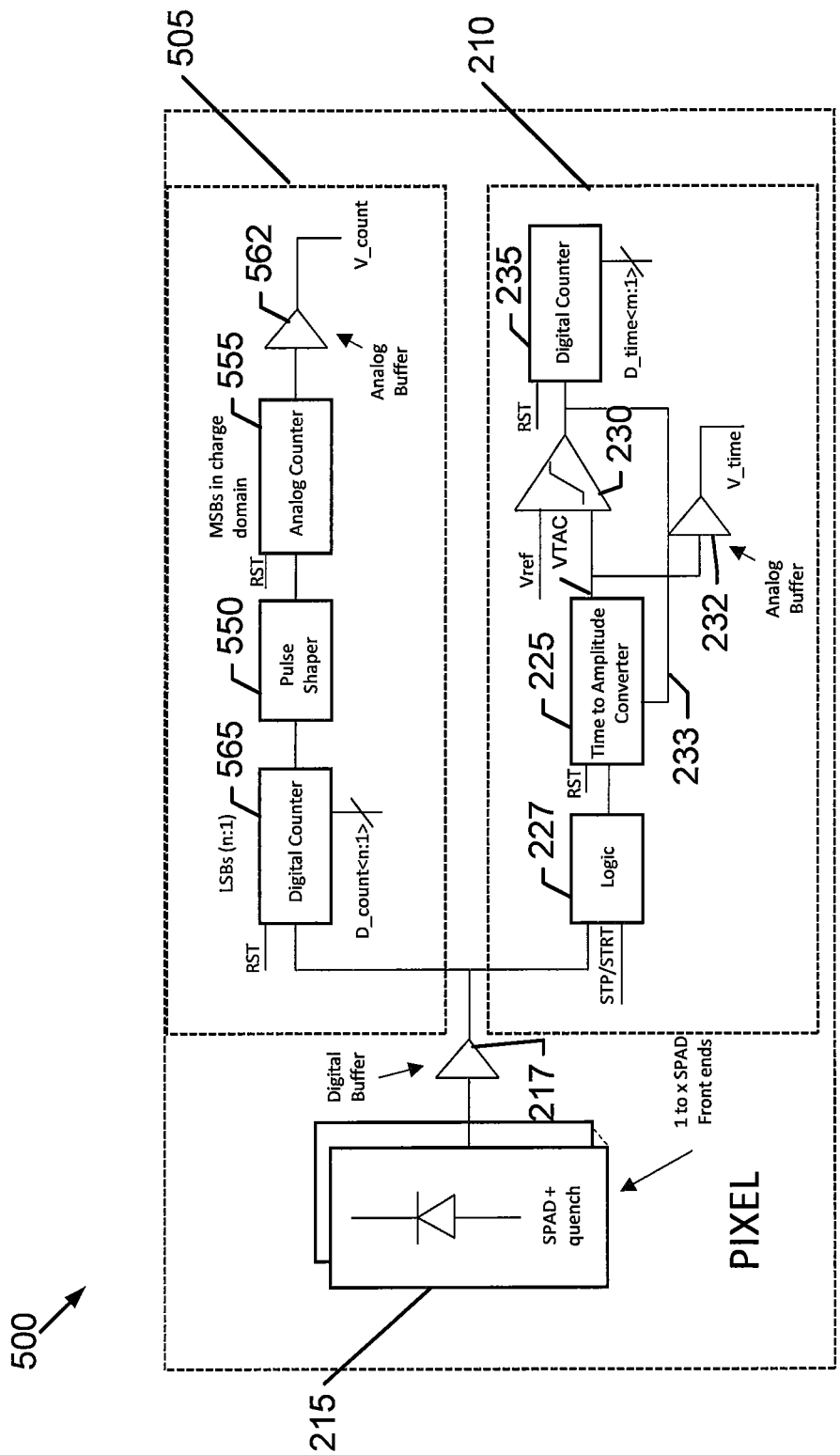

Referring now to FIG. 5, a LIDAR measurement circuit 500 comprises a photon counter circuit 505 and a time integration circuit 210 that are coupled to a pixel 215 in a light detection array that comprises one or more SPADs. The time integration circuit 210 and pixel 215 embodiments are the same as those described above with respect to FIG. 2. In the example shown in FIG. 5, the photon counter circuit 505 is a hybrid design similar to that of FIG. 4, which incorporates both analog and digital functionality. Unlike the hybrid design of FIG. 4, however, the photon counter circuit 505 uses a digital counter to maintain the LSBs of the photon count and uses an analog counter to maintain the MSBs of the photon count. The photon counter circuit 505 comprises a digital counter 565, which may generate a digital count signal D_count<n:1> in response to SPAD pulses output from the pixel 215. The count signal D_count<n:1> may represent the LSBs of the count of the number of photons received. The output count from the digital counter 565 may be used as an input to a pulse shaper 550, which may serve as a filter for the output count from the digital counter 565 to ensure that each time the count transitions from all ones to all zeros an approximately equal amount of charge or voltage is applied to the analog counter 555. It will be understood, however, that the transition point from all ones to all zeros is one example for incrementing the analog counter 555. Other transition points or states may be selected as the trigger state for incrementing the analog counter 555 in accordance with various embodiments of the inventive concept. For example, the analog counter 555 may be incremented upon a toggling of the MSB of the digital counter 565. The analog counter 555 may be configured to output a voltage that is representative of MSBs of the number of SPAD pulses (e.g., photons received) from the pixel 215. The analog counter 555 may be implemented as a capacitor or other suitable charge storage or voltage storage device. An analog buffer 562 may be configured to buffer a voltage V_count corresponding to the MSBs of the count of the number of photons received. The output V_count may be converted to digital form using an analog to digital converter and combined with the output count signal D_count<n:1> of the digital counter 565 in some embodiments of the inventive concept. Both the digital counter 565 and the analog counter 555 may be reset in response to a reset signal RST.

Embodiments of LIDAR measurement circuits that include photon counter circuits, according to some embodiments of the inventive concept, have been described above with respect to FIGS. 2-5. The hybrid photon counter circuit embodiments of FIGS. 4 and 5 (photon counter circuits 405 and 505) may include both analog and digital circuits for determining a photon count. The counting component may be implemented with digital LSBs and analog MSBs or with digital MSBs and analog LSBs in accordance with various embodiments of the inventive concept. While both implementations (i.e., a digital counter that is responsive to analog counter or vice versa) may have advantages and disadvantages with respect to each other, both may have advantages over purely analog or digital solutions. Such advantages of pixels including hybrid counter circuits as described herein include, but are not limited to: reduced area or footprint, as an analog counter can be implemented as a capacitor that can be placed over active electronics (e.g., a digital counter); and reduced leakage as compared to purely analog counting solutions, as fewer bits can be saved on a capacitor by partitioning, thus greater charge leakage can be accommodated on the capacitor. More generally, hybrid counter circuits in accordance with embodiments of the inventive concept can include a mix or any combination of analog LSBs, digital LSBs, analog "Mid-SBs," (i.e., one or more bits between the LSBs and MSBs), digital Mid-SBs, analog MSBs, and/or digital MSBs (e.g., for any of one or more bit positions), which may be selected or otherwise configured to allow sufficient time to reset the capacitor of the analog counter.

Figure 6:
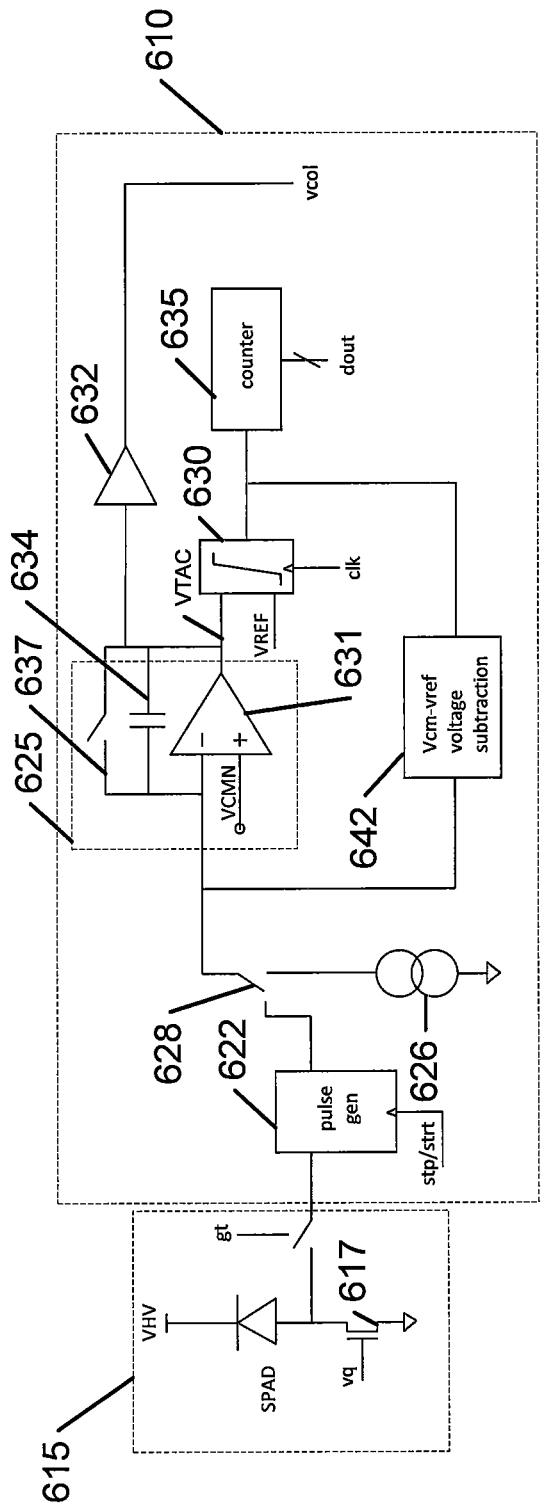
FIG. 6 is block diagram of a time integration circuit according to some embodiments of the inventive concept.

FIG. 6 is block diagram of a time integration circuit, according to some embodiments of the inventive concept, which may be used to integrate or sum the time stamps associated with the receipt of one or more SPAD pulses, which correspond go received photons. Referring to FIG. 6, a time integration circuit 610 is operable responsive to photon detection signals output from a SPAD circuit 615, which may define a pixel. The SPAD circuit 615 includes a SPAD that is connected to a quench and recharge transistor 617, which is configured to receive a static DC bias voltage "vq." The quench and recharge transistor 617 may control the recharge or "dead" time of the SPAD via a global shutter time gate "gt." The time integration circuit 610 may comprise a TAC circuit, which may be implemented using a pulse generator 622, a current source 626, and a Charge Transfer Amplifier (CTA) circuit 625. The pulse generator 622 may generate an output signal that connects or disconnects the current source 626 from the remainder of the time integration circuit 610 by way of a switch 628 responsive to a control signal "stp/strt." Specifically, the pulse generator 622 operates the switch 628 so as to connect the current source 626 to the CTA circuit 625. The voltage signal output from the TAC circuit (VTAC), i.e., output from the CTA circuit 625, has an amplitude that is based on the time that the current source 626 is coupled to the CTA circuit 630. Specifically, the CTA circuit 625 comprises an amplifier 631, a capacitor 634, and a switch 637, which are coupled as shown. The capacitor 634 may store charge based on the amount of time that the current source 626 is coupled to the input of the amplifier 631. In some embodiments, the capacitor 634 may be configured to store a voltage having a magnitude that is at least as large as the voltage that represents the maximum ToF for a single time of arrival. The output voltage of the CTA circuit 625 (VTAC) is provided to a comparator 630 and an analog buffer 632. The CTA circuit 625 may be configured as an integrator amplifier with one input of the operational amplifier being connected to a common voltage VCMN and the capacitor 634 being used as the feedback element.

The analog buffer 632 may be implemented as an active circuit used during readout to buffer analog voltages, which may be stored on a capacitor. In some embodiments, the analog buffer 632 may be a source follower circuit. The output voltage VTAC may represent the time integration or time summation of the time stamps associated with the receipt of one or more SPAD pulses, which correspond to received photons. The CTA circuit 625 output voltage signal VTAC is also provided to a comparator 630, which may increment a digital counter 635 when the output voltage VTAC exceeds a reference voltage VREF. The digital counter 635 may, therefore, output signal "dout," which may provide one or more bits of a digital representation of the time integration or time summation of the time stamps associated with the receipt of one or more SPAD pulses. In other embodiments, an analog counter may be used in place of the digital counter 635. For example, the digital counter 635 may be used to output one or more most significant bits (MSBs), while one or more least significant bits (LSBs) are represented in analog form via the analog buffer 632. In some embodiments, the analog output signal "vcol" from the analog buffer 632 maybe converted to digital form through an analog to digital converter to be combined with the digital output signal "dout" from the digital counter 635. The CTA circuit 625 and TAC circuit may be reset via feedback loop from the output of the comparator 630 by way of a subtractor circuit 642. Example operations of the time integration circuit 610 will now be described with reference to FIGS. 6 and 7.

Figure 7:
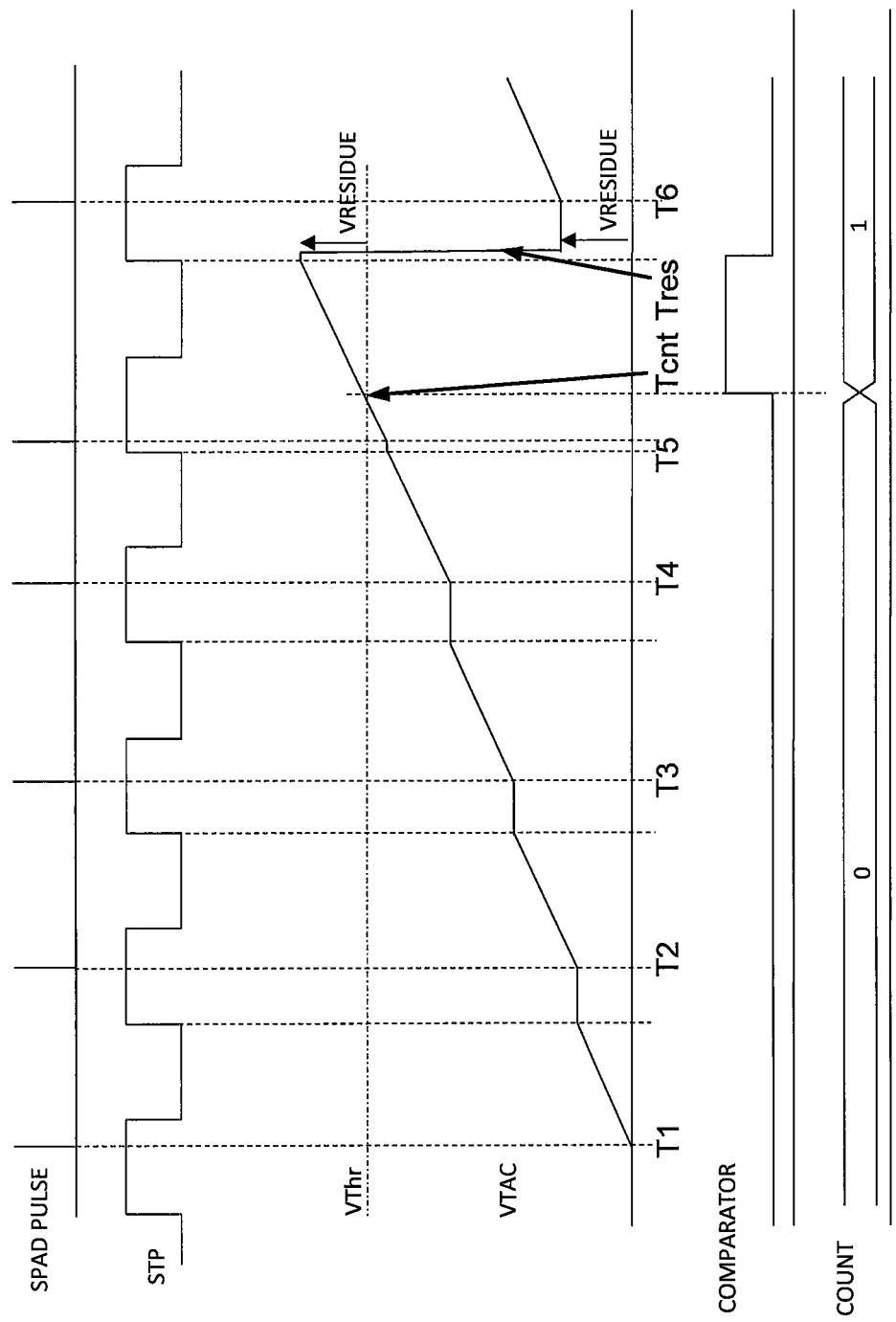
FIG. 7 is a waveform diagram that illustrates operations of a time integration circuit according to some embodiments of the inventive concept.

FIG. 7 is a timing diagram that shows the integration or summation of time stamps associated with example SPAD pulses according to some embodiments of the inventive concept. As shown in FIG. 7, a sequence of six SPAD pulses are received from the SPAD circuit 615 at times corresponding to T1 through T6. The pulse generator 622 couples the current source 626 to the CTA circuit 625 responsive to the STP signal. As a result, the TAC circuit generates an output voltage VTAC at the output of the CTA circuit 625 that rises over time. After a certain number of pulses, e.g., n pulses from m to n, where m can be at least one, at time Tcnt, the comparator 630 determines that the voltage VTAC has exceeded the threshold voltage Vthr, which corresponds to a value of VREF in FIG. 6. In the example of FIG. 7, the voltage VTAC exceeds the threshold voltage VREF or Vthr after five pulses. As a result, the comparator circuit generates an output pulse to increment the digital counter 635 by one. At time Tres, the subtractor circuit 642 may subtract the reference voltage VREF from the current voltage output from the TAC circuit. In the example shown, the current voltage output from the TAC circuit may be represented as VTAC=Vcm. This voltage difference is represented as VRESIDUE, which corresponds to the amount of voltage not represented by the digital count, which now represents a LSB value for the count while the digital count "dout" represents a MSB value for the count. The output of the subtractor 642 may be applied to the input of the CTA circuit 625 to reset the TAC circuit along with operating a switch 637 to clear the charge from the capacitor 634, e.g., at the end of a detection window or subframe. The time integration circuit 610 may then continue to accumulate time stamps, which are indicative of respective times of arrival of photons.

Figure 8:
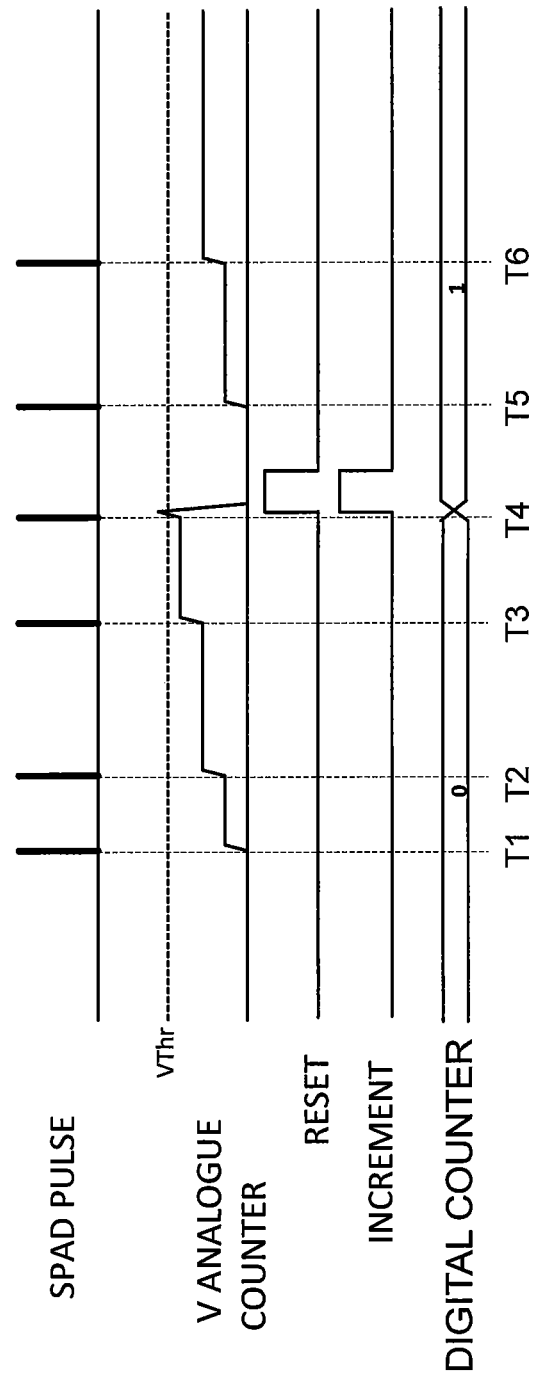
FIG. 8 is a timing diagram that shows the summation of photons associated with example SPAD pulses using a first hybrid counter configuration as shown in FIG. 4 according to some embodiments of the inventive concept.

FIG. 8 is a timing diagram that shows the summation of photons associated with example SPAD pulses according to some embodiments of the inventive concept. Specifically, FIG. 8 illustrates operations for summation of photons using a hybrid photon counter circuit, such as the photon counter circuit 405 described above with respect to FIG. 4. As shown in FIG. 8, a sequence of six SPAD pulses is received from the pixel 215 by way of the digital buffer 217 at times corresponding to T1 through T6. The SPAD pulses are filtered by the pulse shaper 450, which ensures that approximately an equal amount of charge or voltage is applied to the analog counter 455 in response to each pulse. As shown in FIG. 8, each SPAD pulses causes the voltage on the analog counter 455 to increase until the fourth pulse at time T4 causes the voltage on the analog counter 455 to exceed a reference voltage denoted as VThr. When the voltage output from the analog counter 455 exceeds the reference voltage VThr, a RESET signal is applied to the analog counter 455 to reset the voltage/charge stored thereon and an INCREMENT signal is used to increment the digital counter 465. In other embodiments of the inventive concept, the analog counter 455 may start with a defined voltage or charge stored thereon, which is greater than the reference voltage VThr, and the analog counter 455 may be decremented, i.e., the voltage or charge lowered with each SPAD pulse, until the voltage output from the analog counter 455 falls below the reference voltage VThr. The analog counter 455 would then be reset to the defined starting voltage. The process then continues with the analog counter 455 beginning a new count with the reception of the fifth SPAD pulse at time T5 and subsequently a sixth SPAD pulse at time T6. The digital counter 465 will be incremented every time the voltage output from the analog counter 455 exceeds the reference voltage VThr. The analog counter 455 voltage can be read out using the analog buffer 462. In the embodiments of FIG. 4 and FIG. 8, the analog counter 455 output is representative of the LSB portion of the photon count and the digital counter 465 output is representative of the MSB portion of the photon count.

Figure 9:
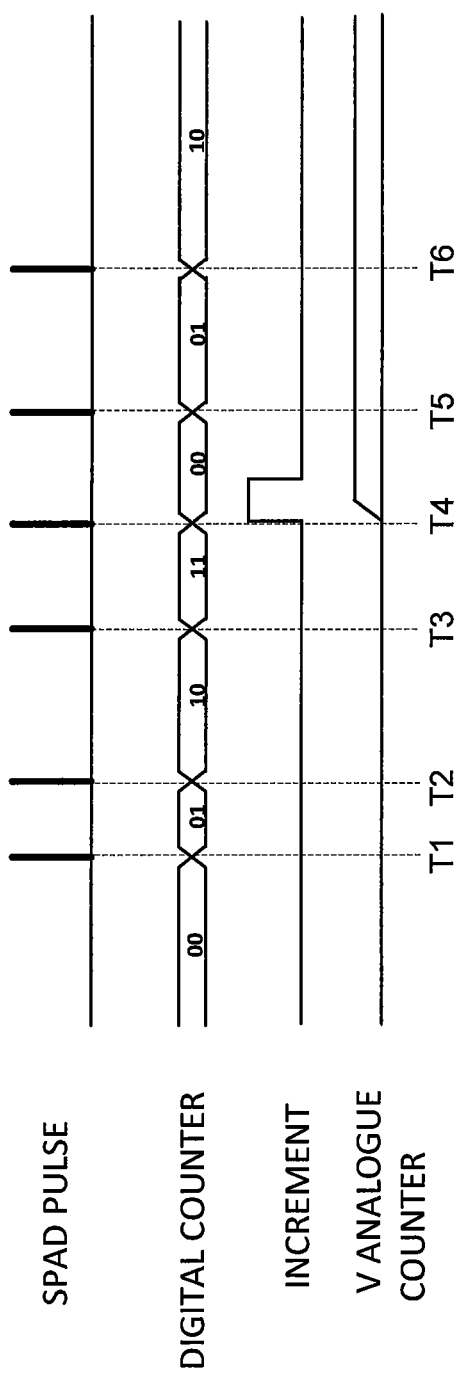
FIG. 9 is a timing diagram that shows the summation of photons associated with example SPAD pulses using a second hybrid counter configuration as shown in FIG. 5 according to some embodiments of the inventive concept.

FIG. 9 is a timing diagram that shows the summation of photons associated with example SPAD pulses according to some embodiments of the inventive concept. Specifically, FIG. 9 illustrates operations for summation of photons using a hybrid photon counter circuit, such as the photon counter circuit 505 described above with respect to FIG. 5. As shown in FIG. 9, a sequence of six SPAD pulses is received from the pixel 215 by way of the digital buffer 217 at times corresponding to T1 through T6. The SPAD pulses increment the digital counter 565 to increase the count thereon at times T1, T2, and T3. At time T4, the fourth SPAD pulse causes the digital counter 565 to roll over from 11 to 00, which results in the analog counter 555 being incremented with a voltage or charge responsive to an INCREMENT signal from the pulse shaper 550. The digital counter 565 continues to count in response to additional SPAD pulses at times T5 and T6. In the example shown in FIG. 9, the transition point for incrementing the analog counter 555 is when the digital counter 565 transitions from 11 to 00. In other embodiments of the inventive concept, different transition points or states may be selected as the transition point or trigger state for incrementing the analog counter 555. The digital counter 565 uses two bits for maintaining a photon count in the example of FIG. 9, but it will be understood that different numbers of bits can be used to store the digital count in accordance with various embodiments of the inventive concept. In addition, in the example shown in FIG. 9, the analog counter 555 is incremented, i.e., voltage increased thereon, when the digital counter transitions from 11 to 00. In other embodiments of the inventive concept, the analog counter 555 may start with a defined voltage or charge stored thereon and the analog counter 555 may be decremented, e.g., the voltage or charge lowered, when the digital counter transitions from one predefined count or state to another predefined count or state, e.g., from 11 to 00 or other defined transition. The analog counter 555 voltage may be read out using the analog buffer 562. In the embodiments of FIG. 5 and FIG. 9, the digital counter 565 output is representative of the LSB portion of the photon count and the analog counter 555 output is representative of the MSB portion of the photon count.

It will be understood that the time integration/summation circuit 610 described above is not limited to the embodiments shown and other implementations may be used in accordance with various embodiments of the inventive concept. Embodiments described herein can also be configured to perform ADC conversion in-pixel; for example, the time integration circuit 610 can be reconfigured by reusing the same capacitor, comparator, and/or counter for single (or dual)-slope conversion.

Some advantages of operations for integration of time stamps in accordance with some embodiments of the inventive concept described herein may include greater LSB size on the integrating capacitor. For example, summing 2000 time stamps on a single capacitor (with 10 bit accuracy) may require an LSB of the TAC voltage to be represented by LSB=(VTAC_MAX)/(2000*2^10). If the maximum TAC voltage VTAC_MAX is matched to the maximum range for a single ToF event (e.g., by selection of a capacitor to hold a voltage that is at least as large as the voltage that represents the maximum ToF for a single time of arrival and/or selection of an equivalent current source) and resetting of the VTAC voltage as described above), the LSB can be represented as LSB=VTACMAX/(2^10), which is an increase of 2000. As such, operations for integration of time stamps in accordance with embodiments described herein can improve the leakage requirements by about 2000 times for single photon time stamps. The number of times that the digital counter increments is the summation of the time stamps.

Further advantages of operations for integration of time stamps in accordance with some embodiments of the inventive concept described herein may include significantly less power than a pure digital implementation, as well as a fixed dynamic range for analog to digital conversion. For example, the voltage on the TAC can be matched to the analog to digital conversion reference without the need for large gain programming ranges.

Some embodiments of the inventive concept described herein may provide improvements in ToF calculation, for example, in that some CMM (or SPAD) based pixels as described herein may allow integration of time stamps on both a capacitor/CTA circuit and in a digital (or analog) counter. As another example, some CMM based pixels (or photon counting pixels) as described herein may combine digital and analog counting methods.

In particular, time stamp integration/summation circuits in accordance with some embodiments of the inventive concept described herein may be configured to accumulate subsets of time stamps in a first circuit part (e.g., using an analog approach) and separately (and/or subsequently) accumulate the overall time stamps in a second circuit part (e.g., using an analog and/or a digital counter). Some advantages of such embodiments may include increased voltage per time stamp LSB, which can improve immunity to noise error and leakage constraints in an analog implementation and may reduce dynamic range requirements on the analog to digital converter. Using analog time stamp integration/summation circuits can provide lower power consumption compared to all-digital solutions.

Furthermore, in some embodiments of the inventive concept, only one of the time integrator or photon counter may be digital and the other may be analog. A benefit of this implementation is that an analog pixel output may be more amenable for implementation in a CMOS Image Sensor architecture, and, in some instances, may also be more area efficient (e.g., using metal-insulator-metal (MiM) capacitors may not occupy silicon real estate). Moreover, some analog implementations may suffer from high noise or from a more limited dynamic range than digital implementations. Therefore, hybrid analog/digital pixels, in accordance with some embodiments of the inventive concept described herein, may achieve improved trade-offs between area, precision, and dynamic range.

It will be understood that the circuits and timing diagrams described and illustrated herein are provided by way of example only, and that embodiments of time integrators, photon counters, and/or other circuits described herein are not limited to these example implementations.

Embodiments of the present disclosure have been described herein with reference to light-based ranging measurement systems (such as LIDAR) and related methods of operation that are configured to reduce the quantity of incoming photons that are measured and/or stored as data in memory. In particular, photons are selectively captured or counted based on a time correlation between their respective times of arrival, which can reduce the quantity of incoming photons that are measured and processed. For example, based on recognition that photons from a pulsed laser and reflected by a target may arrive in a relatively narrow window of time, embodiments described herein can thereby selectively capture or count these correlated photons while rejecting uncorrelated photons from ambient light sources (e.g., the sun), to provide in-pixel averaging without digitizing and storing histograms or other data representative of the captured photons. For example, some embodiments may implement rolling center of mass calculation techniques, as described for example in copending U.S. patent application Ser. No. 16/688,043 entitled "Digital Pixel" filed Nov. 19, 2019, the disclosure of which is incorporated by reference herein.

Lidar systems and arrays described herein may be applied to ADAS (Advanced Driver Assistance Systems), autonomous vehicles, UAVs (unmanned aerial vehicles), industrial automation, robotics, biometrics, modeling, augmented and virtual reality, 3D mapping, and security. In some embodiments, the emitter elements of the emitter array may be vertical cavity surface emitting lasers (VCSELs). In some embodiments, the emitter array may include a non-native substrate having thousands of discrete emitter elements electrically connected in series and/or parallel thereon, with the driver circuit implemented by driver transistors integrated on the non-native substrate adjacent respective rows and/or columns of the emitter array, as described for example in U.S. Patent Application Publication No. 2018/0301872 to Burroughs et al., filed Apr. 12, 2018, with the United States Patent and Trademark Office, the disclosure of which is incorporated by reference herein.

Further Definitions and Embodiments

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

The example embodiments are mainly described in terms of particular methods and devices provided in particular implementations. However, the methods and devices may operate effectively in other implementations. Phrases such as "example embodiment", "one embodiment" and "another embodiment" may refer to the same or different embodiments as well as to multiple embodiments. The embodiments will be described with respect to systems and/or devices having certain components. However, the systems and/or devices may include fewer or additional components than those shown, and variations in the arrangement and type of the components may be made without departing from the scope of the inventive concepts. The example embodiments will also be described in the context of particular methods having certain steps or operations. However, the methods and devices may operate effectively for other methods having different and/or additional steps/operations and steps/operations in different orders that are not inconsistent with the example embodiments. Thus, the present inventive concepts are not intended to be limited to the embodiments shown, but are to be accorded the widest scope consistent with the principles and features described herein.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items. Like reference numbers signify like elements throughout the description of the figures.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the disclosure and, although specific terms are employed, they are used in a generic and descriptive sense only and not for purposes of limitation.

What is claimed is:

1. A Light Detection And Ranging (LIDAR) measurement circuit, comprising:
    a control circuit configured to receive respective detection signals output from one or more single-photon detectors in response to a plurality of photons incident thereon, wherein the control circuit comprises:

a photon counter circuit comprising a digital counter circuit and an analog counter circuit, the digital counter circuit being responsive to an output of the analog counter circuit or the analog counter circuit being responsive to an output of the digital counter circuit to count detection of respective photons of the plurality of photons based on the respective detection signals; and a time integration circuit configured to output a time integration signal representative of respective times of arrival indicated by the respective detection signals;

wherein the control circuit is configured to calculate an estimated time of arrival of the plurality of photons based on a ratio of the time integration signal and the count of the detection of the respective photons of the plurality of photons.

2. The LIDAR measurement circuit of claim 1, wherein the digital counter circuit is configured to generate a digital output that is representative of a first bit portion of the count of the detection of the respective photons of the plurality of photons; and wherein the analog counter circuit is configured to generate an analog output that is representative of a second bit portion of the count of the detection of each of the plurality of photons.

3. The LIDAR measurement circuit of claim 2, wherein the digital counter circuit is responsive to the output of the analog counter circuit;

wherein the first bit portion is a most significant bit portion; and wherein the second bit portion is a least significant bit portion.

4. The LIDAR measurement circuit of claim 2, wherein the analog counter circuit is responsive to the output of the digital counter circuit;

wherein the first bit portion is a least significant bit portion; and wherein the second bit portion is a most significant bit portion.

5. The LIDAR measurement circuit of claim 2, wherein at least one of the first bit portion and the second bit portion comprises a middle bit portion between a most significant bit portion and a least significant bit portion.

6. The LIDAR measurement circuit of claim 1, wherein the time integration circuit is further configured to integrate the respective times of arrival indicated by the respective detection signals on both a charge transfer amplifier circuit and a time integration counter.

7. The LIDAR measurement circuit of claim 6, wherein the time integration counter is a digital counter.

8. The LIDAR measurement circuit of claim 6, wherein the time integration counter is an analog counter.

9. The LIDAR measurement circuit of claim 6, wherein the time integration circuit comprises:

a time to amplitude converter that comprises the charge transfer amplifier circuit and is configured to generate an output voltage responsive to the respective detection signals;

a comparator that is configured to generate an output signal responsive to the output voltage of the time to amplitude converter exceeding a reference voltage;

wherein the time integration counter is configured to increment an integrated count of the respective times of arrival responsive to the output signal of the comparator.

10. The LIDAR measurement circuit of claim 9, wherein the time integration circuit further comprises:

a pulse generator circuit; and a current source;

wherein the pulse generator circuit is configured to couple the current source to the charge transfer amplifier circuit responsive to the respective detection signals and a control signal.

11. The LIDAR measurement circuit of claim 10, wherein the time to amplitude converter is configured to generate the output voltage responsive to a time that the current source is coupled to the charge transfer amplifier circuit.

12. The LIDAR measurement circuit of claim 9, wherein the time integration circuit further comprises:

a reset circuit that is configured to reset the time to amplitude converter by subtracting the reference voltage from the output voltage of the time to amplitude converter to generate a reset voltage and applying the reset voltage to an input of the charge transfer amplifier circuit.

13. The LIDAR measurement circuit of claim 12, wherein the reset voltage represents a first bit portion of an integration of the count of the respective times of arrival;

wherein an output of the time integration counter represents a second bit portion of the integration of the count of the respective times of arrival.

14. The LIDAR measurement circuit of claim 12, wherein the first bit portion is a least significant bit portion; and wherein the second bit portion is a most significant bit portion.

15. The LIDAR measurement circuit of claim 9, wherein the charge transfer amplifier comprises at least one capacitor that is configured to store a voltage that is at least as large as a voltage corresponding to an expected or maximum time of flight for a respective time of arrival.

16. The LIDAR measurement circuit of claim 1, wherein the single-photon detectors are part of a center of mass method (CMM) based pixel.

17. The LIDAR measurement circuit of claim 16, wherein the time integration circuit comprises:

a time to amplitude converter that comprises the charge transfer amplifier circuit and is configured to generate an output voltage responsive to the respective detection signals; and a comparator that is configured to generate an output signal responsive to the output voltage of the time to amplitude converter exceeding a reference voltage;

wherein the time integration counter is configured to increment an integrated count of the respective times of arrival responsive to the output signal of the comparator.

18. The LIDAR measurement circuit of claim 17, wherein the time integration circuit further comprises:

a reset circuit that is configured to reset the time to amplitude converter by subtracting the reference voltage from the output voltage of the time to amplitude converter to generate a reset voltage and applying the reset voltage to an input of the charge transfer amplifier circuit.

19. A Light Detection And Ranging (LIDAR) measurement circuit, comprising:

a control circuit configured to receive respective detection signals output from one or more single-photon detectors in response to a plurality of photons incident thereon, wherein the control circuit comprises:

a photon counter circuit configured to count detection of respective photons of the plurality of photons based on the respective detection signals; and a time integration circuit configured to output a time integration signal representative of respective times of arrival indicated by the respective plurality of detection signals on both a charge transfer amplifier circuit and a time integration counter;

wherein the control circuit is configured to calculate an estimated time of arrival of the plurality of photons based on a ratio of the time integration signal and the count of the detection of the respective photons of the plurality of photons.

20. The LIDAR measurement circuit of claim 19, wherein the time integration counter comprises a digital counter or an analog counter;

wherein the digital counter comprises a flip-flop circuit; and wherein the analog counter comprises a capacitor.

* * * * *